(12) United States Patent
Biber et al.

(10) Patent No.: US 8,674,699 B2
(45) Date of Patent: Mar. 18, 2014

(54) MAGNETIC RESONANCE TOMOGRAPHY LOCAL COIL

(75) Inventors: Stephan Biber, Erlangen (DE); Karsten Jahns, Buckenhof (DE); Jörg Rothard, Litzendorf (DE)

(73) Assignee: Siemens Aktiengesellschaft, München (DE)

( * ) Notice: Subject to any disclaimer, the term of this patent is extended or adjusted under 35 U.S.C. 154(b) by 224 days.

(21) Appl. No.: 13/171,420

(22) Filed: Jun. 28, 2011

(65) Prior Publication Data

US 2012/0025830 A1 Feb. 2, 2012

(30) Foreign Application Priority Data

Jun. 29, 2010 (DE) .......................... 10 2010 025 479

(51) Int. Cl.
*G01V 3/00* (2006.01)
(52) U.S. Cl.
USPC .......................................... 324/322; 324/318
(58) Field of Classification Search
USPC .................................. 324/318, 319, 320, 322
See application file for complete search history.

(56) References Cited

U.S. PATENT DOCUMENTS

| 5,280,246 A * | 1/1994 | Takahashi et al. ............ 324/322 |
| 6,597,173 B1* | 7/2003 | Bernstein ...................... 324/318 |
| 7,800,370 B2* | 9/2010 | Du et al. ....................... 324/318 |
| 7,924,009 B2* | 4/2011 | Bosshard et al. ............. 324/318 |

FOREIGN PATENT DOCUMENTS

| DE | 103 14 215 B4 | 11/2006 |
| DE | 10 2007 002 187 A1 | 7/2008 |
| DE | 10 2009 003 865 A1 | 11/2009 |
| WO | WO 2008/078239 A1 | 7/2008 |

OTHER PUBLICATIONS

German Office Action dated Apr. 6, 2011 for corresponding German Patent Application No. DE 10 2010 025 479.7-54 with English translation.

* cited by examiner

*Primary Examiner* — Louis Arana
(74) *Attorney, Agent, or Firm* — Lempia Summerfield Katz LLC

(57) ABSTRACT

The present embodiments relate to a local coil for a magnetic resonance tomography system. The local coil extends in a first direction and in a second direction orthogonal to the first direction. The local coil has a plurality of coil elements. At least some coil elements of the plurality overlap at least partly in a third direction running between the first direction and the second direction.

21 Claims, 3 Drawing Sheets

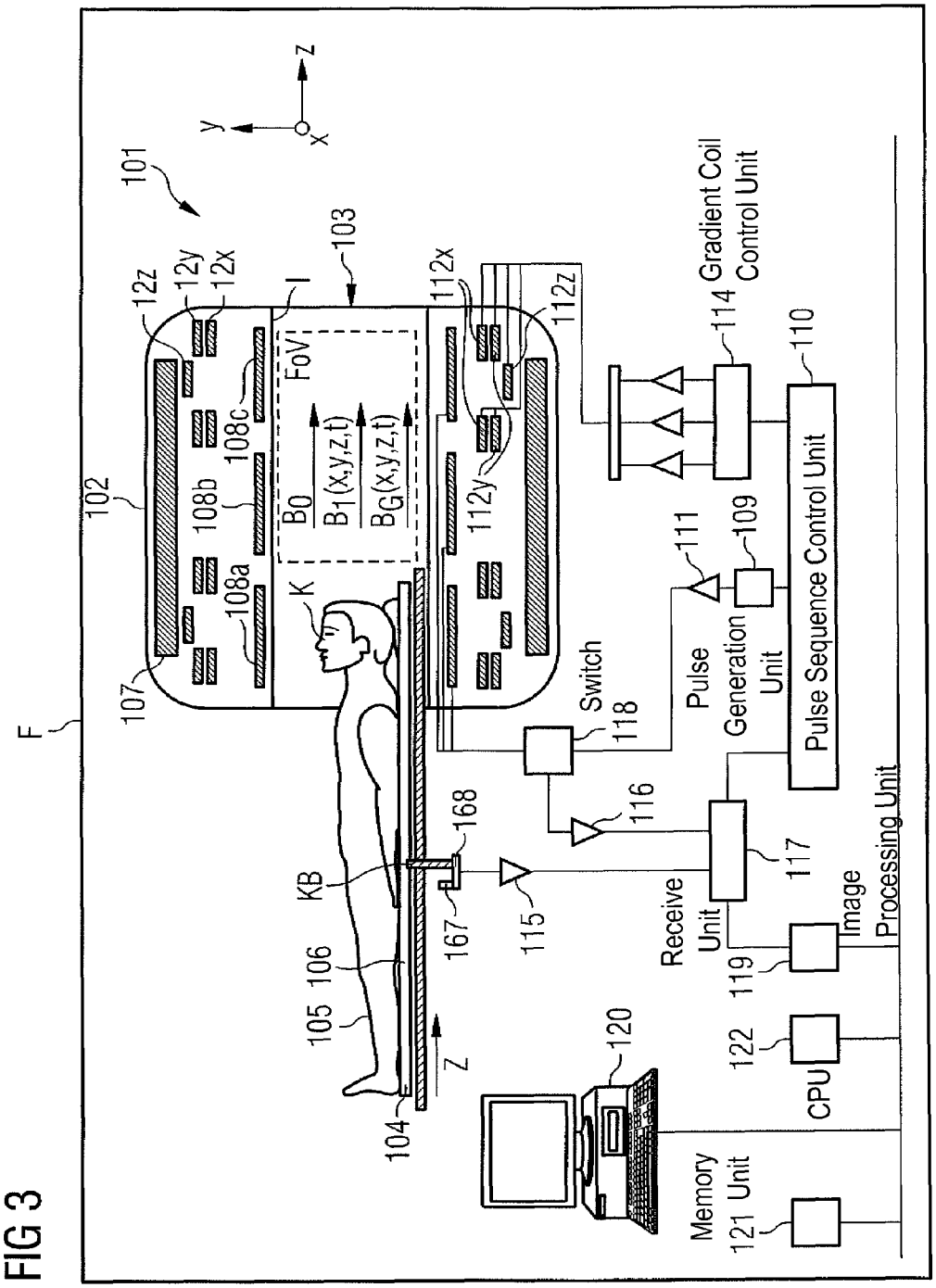

MAGNETIC RESONANCE TOMOGRAPHY LOCAL COIL

This application claims the benefit of DE 10 2010 025 479.7, filed on Jun. 29, 2010.

BACKGROUND

The present embodiments relate to a local coil for a magnetic resonance tomography (MRT) system.

MRT devices for examination of objects or patients by magnetic resonance tomography (MRT, magnetic resonance imaging (MRI)) are known, for example, from DE10314215B4.

SUMMARY

The present embodiments may obviate one or more of the drawbacks or limitations in the related art. For example, a magnetic resonance tomography (MRT) local coil for an MRT system may be further optimized.

BRIEF DESCRIPTION OF THE DRAWINGS

FIG. 3 shows an MRT system.

DETAILED DESCRIPTION OF THE DRAWINGS

Figure 1:
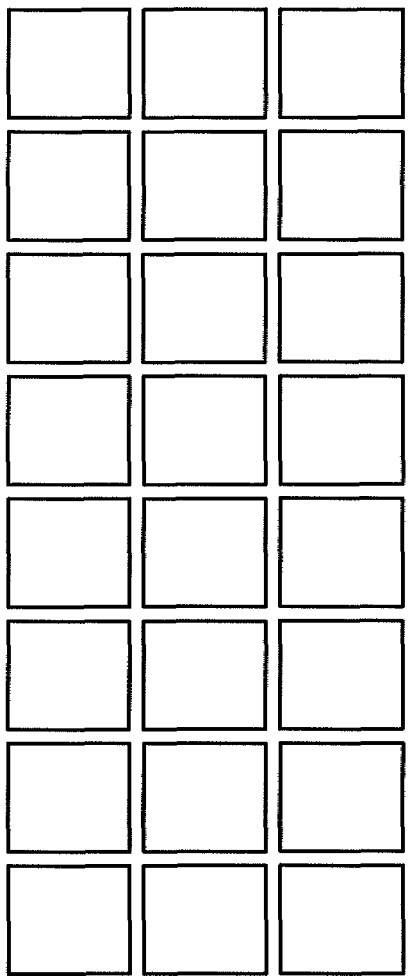
FIG. 1 shows a magnetic resonance tomography (MRT) local coil on the left and one embodiment of another MRT local coil on the right.
Figure 1:
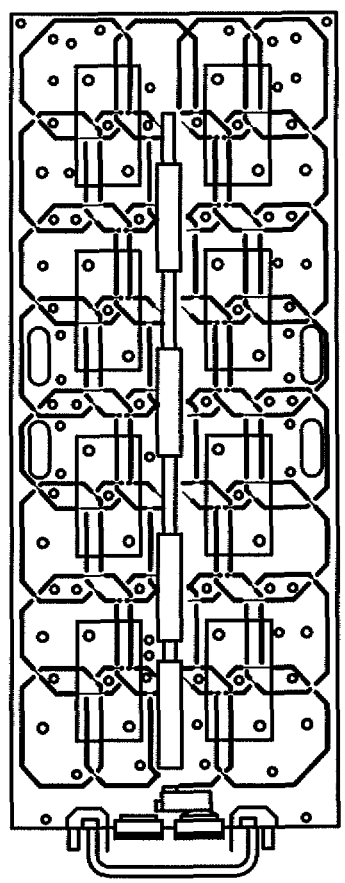

FIG. 3 shows an imaging magnetic resonance device MRT 101 (e.g., located in a shielded room or Faraday cage F) including a whole-body coil 102 with a tubular space 103, in which a patient bed 104 with a body 105 (e.g. of a patient) of an object under examination (e.g., with or without a local coil arrangement 106), for example, may be moved in the direction of the arrow z, in order to generate images of the patient 105 through an imaging method. As shown in FIG. 3, the local coil arrangement 106 is placed on and/or under the patient (e.g. for spine coils on or in the patient table), with which images may be generated in a local area (e.g., the field of view). Signals of the local coil arrangement 106 may be analyzed (e.g., converted into images, stored or displayed) by an analysis device (e.g., elements 115, 117, 119, 120, 121) of the imaging magnetic resonance device MRT 101 connected to the local coil arrangement 106 via, for example, a local coil connecting line KX (e.g., a coaxial cable) or by radio (e.g., elements 167, 168).

In order to examine the body 105 with the imaging magnetic resonance device MRT 101 using magnetic resonance imaging, different magnetic fields matched to each other in temporal and spatial characteristics are directed onto the body 105. A strong magnet (e.g., a cryomagnet 107) in a measurement compartment (e.g., with a tunnel-shaped opening 103) generates a statically-strong main magnetic field $B_0$ that may be between 0.2 Tesla and 3 Tesla or more. The body 105 to be examined is supported on a patient bed 104 and is moved into a roughly homogeneous region of the main magnetic field $B_0$ in the field of view (FoV). Nuclear spins of atomic nuclei of the body 105 are excited via magnetic radio-frequency excitation pulses $B1(x, y, z, t)$ that are beamed in via a radio-frequency antenna shown in FIG. 3 in simplified form as a body coil 108 (e.g., a high-frequency antenna, a multipart body coil 108a, 108b, 108c and/or a local coil array). Radio-frequency excitation pulses are generated, for example, by a pulse generation unit 109 that is controlled by a pulse sequence control unit 110. After amplification by a high-frequency amplifier 111, the amplified radio-frequency excitation pulses are conveyed to the high-frequency antenna 108. The radio-frequency system shown in FIG. 3 is indicated schematically. In other embodiments, more than one pulse generation unit 109, more than one radio-frequency amplifier 111 and a plurality of radio-frequency antennas 108a, b, c are used in the imaging magnetic resonance device MRT 101.

The imaging magnetic resonance device MRT 101 has gradient coils 112x, 112y, 112z, with which magnetic gradient fields for selective slice excitation and for local encoding of the measurement signal are beamed in during a measurement. The gradient coils 112x, 112y, 112z are controlled by a gradient coil control unit 114 that, like the pulse generation unit 109, is connected to the pulse sequence control unit 110.

Signals sent out from excited nuclear spins (e.g., atomic nuclei in the object under examination) are received by the body coil 108 and/or at least one local coil array 106, are amplified by assigned radio-frequency amplifiers 116, and are further processed and digitized by a receive unit 117. The recorded measurement data is digitized and is stored as complex numerical values in a k-space matrix. An associated MR image may be reconstructed using a multidimensional Fourier transformation from the k-space matrix occupied by values.

For a coil that may be operated both in transmit and receive mode (e.g., the body coil 108 or a local coil), the correct signal forwarding is regulated by an upstream transmit-receive switch 118.

An image processing unit 119 generates an image from the measurement data. The image is displayed to a user via an operating console 120 and/or is stored in a memory unit 121. A central processing unit 122 controls the individual system components.

Images with a high signal-to-noise ratio (SNR) may be recorded in magnetic resonance (MR) tomography with local coil arrays (e.g., coils, local coils). The local coil arrays are antenna systems that are attached in the immediate vicinity on (anterior), below (posterior) or in the body. For an MR measurement, the excited nuclei induce a voltage in the individual antennas of the local coil. The induced voltage is amplified by a low noise pre-amplifier (e.g., LNA, preamp) and is forwarded to receive electronics. To improve the signal-to-noise ratio even with high-resolution images, high-field systems are employed (e.g., 1.5 T and more). When several individual antennas that are present as receivers may be connected to an MR receive system, a switching matrix (referred to here as RCCS) is integrated between receive antennas and receiver. This routes currently active receive channels (e.g., receive channels that lie in the field of view of the magnet) to the available receivers. Accordingly, a number of coil elements that are present as receivers may be connected, since for whole-body coverage, the coils that are located in the FoV or in the homogeneity volume of the magnet are read out.

An antenna system may be a local coil positioning arrangement 106 that, for example, may include one antenna element or an array coil of a plurality of antenna elements (or coil elements). Individual antenna elements are configured, for example, as loop antennas (loops), butterfly coils, or saddle coils. The local coil array may include coil elements, a preamplifier, further electronics (e.g., baluns), a housing, supports and a cable KB, for example, with a plug, through which the local coil array is connected to the magnetic resonance tomography (MRT) system (e.g., elements 168, 117). A receiver 168 attached to the system side filters and digitizes a signal received by radio by a local coil 106, for example, and transfers the data to a digital signal processing system that may derive an image or a spectrum from the data obtained by the measurement. The digital signal processing system makes the image available to the user for subsequent diagnosis by the user and/or storage, for example.

Exemplary embodiments of MRT baluns are described below in greater detail with reference to FIGS. 1-2.

The left-hand side of FIG. 1 shows a simplified diagram of an MRT local coil in the form of a known spine coil, and the right-hand side of FIG. 1 shows a simplified diagram in cross-section of one embodiment of an MRT local coil (e.g., as the spine coil) with a modified structure.

In MR tomography, images with a high signal-to-noise ratio may be recorded with loops. In this process, excited nuclei induce a voltage in the MRT local coil. The induced voltage is amplified with a low-noise amplifier (LNA) and forwarded via a cable connection at an MR frequency to the receive electronics. To improve the signal-to-noise ratio for high-resolution images as well, high-field systems are used. The basic field strengths of the high-field systems may be 3 Tesla or higher.

Since a number of coil elements (loops) that are to be connectable to the MR receive system are present as receivers, a switching matrix (e.g., the RCCS) is fitted between receive antennas and receivers. This routes the currently active receive channels to the existing receivers. Accordingly, a number of coil elements that are present as receivers may be connected, since for whole-body coverage, coils that are located in the FoV or in the homogeneity volume of the magnet are read out.

The individual antenna elements are also referred to as loops below. A local antenna arrangement is also referred to as a "coil" or "local coil." The local antenna arrangement may include one or a plurality of coil elements (e.g., in the case of an array coil). The local coil may include, for example, loops, a preamplifier, further electronics and internal cabling, a housing, a cable with a plug through, which the local coil is connected to the system, or a combination thereof. An MRT system may also be the "system" below. To reduce the measurement time, "parallel imaging methods" (e.g., iPAT) are used in MRT. The parallel imaging methods use the spatial resolution of the individual receive coil elements in order to reduce the measurement time. The greater the number of coil elements on a given geometry, the more widely acceleration techniques may be used. The result of a high number of channels in local coils (e.g., since the patient geometries remain similar) is also that the individual coil elements become smaller. Smaller coil elements deliver a higher SNR in the vicinity of the coil than larger coil elements. The increase in the number of channels in a local coil thus delivers at least two benefits: (1) better picture quality in the vicinity of the receive antennas; and (2) better picture quality overall when iPAT is used.

If many local coil elements are operated in the immediate vicinity of one another, the local elements are decoupled from one another, since coupling may otherwise lead to increased noise in the image. Inductive and capacitive decoupling techniques may be used, for example. Individual coil elements may, for example, be decoupled inductively by overlap or by transformers. The coil elements of the spine coil may also be arranged so that, in addition to abdominal imaging, the coil elements may be used for spine imaging.

If the coil is larger than the FoV, only coil elements that lie in the FoV may be connected to receivers.

Figure 2:
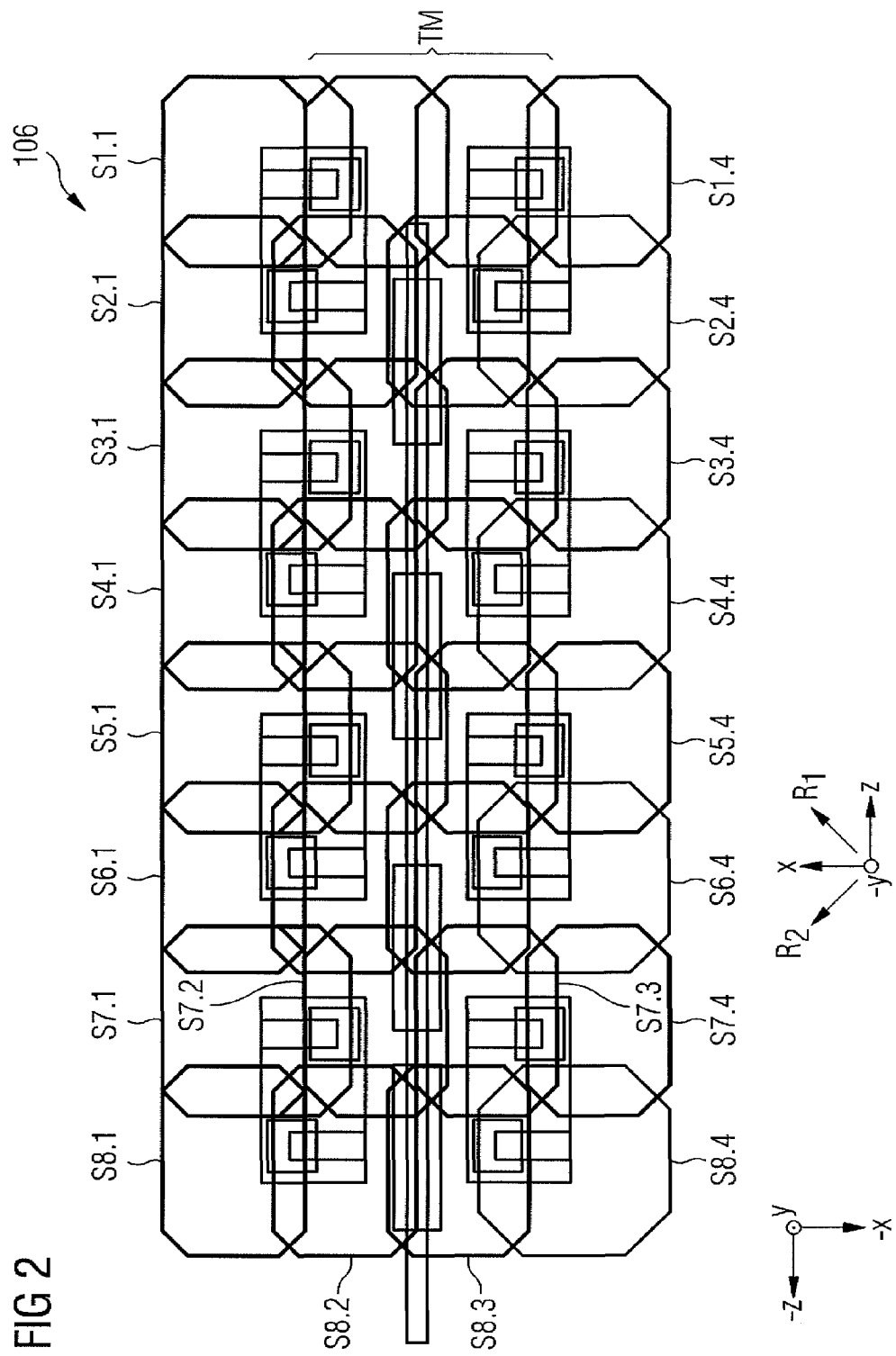
FIG. 2 shows one embodiment of an MRT local coil.

FIG. 2 shows one embodiment of a local coil 106 in the form of a coil usable for imaging of the spine and/or the abdomen of an object under examination, for example. The local coil 106 extends in a first direction z (e.g., the z-direction) and extends in a second direction x (e.g., the x-direction) orthogonal to the first direction (e.g., the local coil has a spatial extension in the first direction and the second direction and/or has coil elements lying alongside one another and/or at least partly overlapping each other in the first direction and the second direction).

The local coil 106 has a plurality of coil elements S1.1 to S8.4 (e.g., each coil element of the plurality with an antenna and a connection/cable to a plug or to an MRT analysis device).

Of the plurality of coil elements S1.1 to S8.4 of the local coil 106, some coil elements (e.g., S1.1, S2.1, S3.1, S4.1, S5.1, S6.1, S7.1, S8.4) viewed in the first direction z, are arranged next to each other and/or partly overlap each other. Some coil elements of the plurality (e.g. S8.1, S8.2, S8.3 S8.4) viewed in the second direction x are arranged next to one another and/or partly overlap each other. For example, one coil element in each case partly overlaps another coil element in the second direction x and/or the first direction z on one or two sides.

At least some of the coil elements (e.g., S8.2 and S7.3; S8.3 and S7.2) of the local coil 106 overlap each other in one or two of a third direction and a fourth direction (e.g., the third and fourth diagonal directions) extending between the first direction z and the second direction x (e.g., approximately diagonally in FIG. 2 and/or diagonal to two MRT axes x and z).

In one embodiment, the coil elements are decoupled inductively (e.g., only inductively from one another) by overlapping. An arrangement of the coil elements is shown in FIG. 2. The advantage of this arrangement is both a low-cost and also a low-noise decoupling, such that all adjacent coil elements (e.g., in the second direction x, the first direction z, and the third and fourth diagonal directions) are decoupled inductively from each other, and no discrete transformers (e.g., for decoupling) are needed for the adjacent coil elements.

An arrangement of four coil elements (e.g., S8.1 to S8.4) in the x-direction is favorable for iPAT. The spinal-cord lying close below the skin in large parts of the body of an object under examination is illuminated by the two or more relatively small coil elements (e.g., 8.2 and S8.3.) in the center (e.g., area TM) of the local coil 106 with respect to receiving and/or sending. In area TM, higher SNR is to be expected subcutaneously. The purely inductive decoupling of direct coil element neighbors in the x-direction, the z-direction, and third and fourth diagonal directions uses larger coil elements (e.g., S8.1 and S8.2) only at the edges of the coil (e.g., where the spine does not lie). The combination of the four coil element arrangement(s) with the decoupling in the antenna arrangement shown in FIG. 2 allows both improved iPAT performance through the higher number of channels and also an increase of the SNR in areas that are of interest for spine imaging. This principle (e.g., low-cost and low-noise decoupling and improved spine SNR) may be extended to all spine coil arrangements with, for example, even numbers of coil elements in the x-direction.

The combination of the low-cost and low-noise decoupling principle (e.g., inductive decoupling by overlap and decoupling of neighbors in the x-direction, the z-direction, and the third and fourth diagonal directions (e.g., approximately diagonal directions)) for a spine coil with an antenna arrangement that, because of the smaller coil elements, allows better SNR in the area of the spinal cord makes a cost reduction and quality optimization for spine local coils possible.

An internal switchover may be provided by a coil element signal selection device RCCS if the spine coil is equipped with a sufficient number of connectors. Since, however, this may be less than optimum for the connection forces and the mechanical connection and disconnection of the coils, a plurality of receive channels may be transmitted over a line (e.g., a plug-in contact). A frequency division multiplex (FDM) may be used. For example, two adjacent coil elements of the plurality in the x-direction are transmitted on one cable by frequency division multiplexing. By transmitting the neighboring coil elements in the x-direction over one cable (e.g., by FDM, CDMA, TDM), with the movement of the local coil in the-z direction, only the channels of one analysis device RCCS (e.g., element 117; which may not operate frequency-selectively) of an MRT are routed to the receiving coil element or elements (e.g., connected) that lie in the FoV.

Multiplexing methods (e.g., a number of channels are transmitted on one cable) such as FDM may be used to allow connections to all coil elements to be routed out of the local coil (e.g., to an analysis device of the MRT system) and allow the choice of coil elements that are to be used to be made by the receiver by a central switching matrix (RCCS). This saves money. If a number of channels are transmitted on one cable (e.g., by multiplexing methods as stated above), then a number of coil elements are combined (e.g., by FDM only in channels that lie in the x-direction next to each other).

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance tomography system, the local coil extending in a first direction and in a second direction, the second direction being orthogonal to the first direction, the local coil comprising:
   a plurality of coil elements comprising at least two pairs of coil elements,
   wherein coil elements of a first pair of the at least two pairs of coil elements at least partly overlap in a third direction between the first direction and the second direction, and coil elements of a second pair of the at least two pairs of coil elements at least partly overlap in the third direction.

2. The local coil as claimed in claim 1, wherein the third direction extends at least approximately diagonally to the first direction and to the second direction.

3. The local coil as claimed in claim 1, wherein less than all of the plurality of coil elements overlap in the third direction.

4. The local coil as claimed in claim 1, wherein a first portion of coil elements of the plurality, viewed in the first direction, are arranged next to one another or overlap one another, and a second portion of coil elements of the plurality, viewed in the second direction, are arranged next to one another or overlap one another.

5. The local coil as claimed in claim 1, wherein the first direction and the second direction are inclined in a position of the local coil to the vertical usable for an imaging examination of an object under examination, or run at least approximately horizontally.

6. The local coil as claimed in claim 1, wherein mutual overlapping of at least two coil elements of the plurality in relation to each other is visible in a horizontal cross-section through the local coil in a used position.

7. The local coil as claimed in claim 1, wherein the first direction is a direction of entry of an object under examination into a magnetic resonance device.

8. The local coil as claimed in claim 1, wherein coil elements of the plurality are inductively decoupled from one another by mutual overlapping.

9. The local coil as claimed in claim 1, wherein all coil elements of the plurality overlap each other diagonally at least in a spatial part area of the local coil.

10. The local coil as claimed in claim 1, wherein each coil element of the plurality overlaps diagonally with three additional coil elements of the plurality at least in a spatial part area of the local coil.

11. The local coil as claimed in claim 10, wherein the spatial part area is a central part area of the local coil.

12. The local coil as claimed in claim 1, wherein the plurality of coil elements only overlap each other partly.

13. The local coil as claimed in claim 1, wherein the local coil is a spine coil, an abdominal coil, or a spine and abdominal coil.

14. The local coil as claimed in claim 1, wherein coil elements of the plurality adjacent to each other in the first direction, the second direction, or the third direction are only decoupled from one another inductively.

15. The local coil as claimed in claim 1, wherein a plurality of receive channels, at least some coil elements of the plurality, or the plurality of receive channels and the coil elements are connected or connectable through a multiplex over a line, a plug-in contact, or the line and the plug-in contact to an analysis device of a magnetic resonance device.

16. The local coil as claimed in claim 1, wherein two neighboring coil elements of the plurality in the second direction are connected or connectable via a line, a plug-in contact, or the line and the plug-in contact to an analysis device of a magnetic resonance device by a frequency division multiplex.

17. The local coil as claimed in claim 1, wherein connections of the plurality of coil elements are routed outwards from the local coil, and
   wherein a central switching device provides a selection option for coil elements of the plurality that are to be used by an analysis device of a magnetic resonance device.

18. The local coil as claimed in claim 1, wherein at least some coil elements of the plurality at least partly overlap in a fourth direction running between the first direction and the second direction at an angle of 30-60 degrees.

19. The local coil as claimed in claim 1, wherein each coil element of the plurality has at least one antenna.

20. The local coil as claimed in claim 18, wherein the fourth direction runs between the first direction and the second direction at an angle of 40-50 degrees.

21. The local coil as claimed in claim 1, wherein the plurality of coil elements comprises at least two other pairs of coil elements, and
   wherein coil elements of a first pair of the at least two other pairs of coil elements at least partly overlap in only the second direction, and coil elements of a second pair of the at least two other pairs of coil elements at least partly overlap in only the second direction.

* * * * *